(12) United States Patent
Hoppe et al.

(10) Patent No.: US 8,641,046 B2
(45) Date of Patent: Feb. 4, 2014

(54) PISTON RING

(75) Inventors: Steffen Hoppe, Overath (DE); Manfred Fischer, Leichlingen (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 107 days.

(21) Appl. No.: 12/936,003

(22) PCT Filed: Mar. 18, 2009

(86) PCT No.: PCT/EP2009/053192
§ 371 (c)(1),
(2), (4) Date: Dec. 27, 2010

(87) PCT Pub. No.: WO2009/121719
PCT Pub. Date: Oct. 8, 2009

(65) Prior Publication Data
US 2011/0101620 A1    May 5, 2011

(30) Foreign Application Priority Data

Apr. 2, 2008    (DE) .................. 10 2008 016 864

(51) Int. Cl.
*F16J 9/26*    (2006.01)
(52) U.S. Cl.
USPC ........... 277/442; 428/216; 428/336; 428/408; 428/457; 428/472; 428/698
(58) Field of Classification Search
USPC .......... 277/442; 428/336, 216, 408, 457, 472, 428/698
See application file for complete search history.

(56) References Cited

U.S. PATENT DOCUMENTS

| | | | | |
|---|---|---|---|---|
| 4,734,339 A | * | 3/1988 | Schachner et al. | 428/698 |
| 5,662,999 A | * | 9/1997 | Taniguchi et al. | 428/366 |
| 6,228,471 B1 | | 5/2001 | Neerinck et al. | |
| 6,716,540 B2 | * | 4/2004 | Kohara et al. | 428/408 |
| 6,740,393 B1 | * | 5/2004 | Massler et al. | 428/216 |
| 7,160,616 B2 | * | 1/2007 | Massler et al. | 428/408 |
| 7,318,847 B2 | * | 1/2008 | Massler et al. | 428/698 |
| 7,498,083 B2 | * | 3/2009 | Yamamoto et al. | 428/408 |
| 7,887,919 B2 | * | 2/2011 | Yamamoto et al. | 428/408 |
| 7,947,372 B2 | * | 5/2011 | Dekempeneer | 428/408 |
| 8,033,550 B2 | * | 10/2011 | Jacquet et al. | 277/442 |
| 2007/0078067 A1 | | 4/2007 | Nakagawa et al. | |
| 2008/0076683 A1 | * | 3/2008 | Okamoto et al. | 508/103 |
| 2008/0166287 A1 | * | 7/2008 | Venkatraman et al. | 423/446 |
| 2008/0220257 A1 | | 9/2008 | Dekempeneer | |
| 2009/0001669 A1 | | 1/2009 | Hoppe et al. | |

FOREIGN PATENT DOCUMENTS

| | | |
|---|---|---|
| EP | 0971048 A1 | 1/2001 |
| EP | 1272683 B1 | 11/2005 |
| JP | 01-226711 | 9/1989 |
| JP | 2000-119843 * | 4/2000 |
| JP | 2000-256850 * | 9/2000 |
| JP | 2001-225412 * | 8/2001 |
| JP | 2002-088465 * | 3/2002 |
| JP | 2004 010923 A | 1/2004 |
| JP | 2007-314838 * | 12/2007 |
| WO | WO 01/79585 A1 | 10/2001 |
| WO | WO 03/091474 A1 | 11/2003 |
| WO | WO 2007/020138 A1 | 7/2006 |
| WO | WO 2006/125683 | 11/2006 |
| WO | WO 2007/020139 A1 | 2/2007 |

OTHER PUBLICATIONS

0.Takai, V. Anita and N. Saito, Properties of DLC Thin Films Produced by RF PE-CVD From Pyrrole Monomer, Surface and Coatings Technology 200 (2005) 1106-1109.
A. Grill, V. Patel and S. Cohen, Electrical Resistivites of Diamon-Like Carbon, Diamond and Related Material, 3 (1994) 281-284.
Alfred Grill, Diamond-Like Carbon: State of the Art, Diamond and Related Materials, (1999) 428-434.

* cited by examiner

*Primary Examiner* — Archene Turner
(74) *Attorney, Agent, or Firm* — Robert L. Stearns; Dickinson Wright, PLLC

(57) ABSTRACT

A piston ring with a DLC coating comprises an adhesive layer on a base material from inside to outside, an amorphous metallic hydrocarbon layer and an amorphous non-metallic hydrocarbon layer, wherein primarily $sp^2$ bonds predominate in the metallic hydrocarbon layer and the non-metallic hydrocarbon layer comprises $sp^2$ and $sp^3$ bonds, the $sp^3$ bond fraction being higher than in the metallic hydrocarbon layer so that an electrical resistance of the DLC coating arises, said resistance being in the range greater than 5000 ohms, in particular greater than 5000 kohms.

6 Claims, No Drawings

PISTON RING

TECHNICAL FIELD

The invention relates to a piston ring having a novel coating.

Piston rings are used in internal combustion engines in order to provide as perfect a sealing as possible between the piston that moves up and down and the cylinder wall. Furthermore, piston rings serve to wipe off the oil located on the cylinder wall and to maintain the usability of the oil for lubrication. The fundamental requirements placed on piston rings are the lowest possible friction and the longest possible service life under the, in part, extreme conditions during the operation of an internal combustion engine. This implies a wear behavior in which the piston ring meets the requirements placed on it as long as possible.

RELATED ART

WO 2007/020139 A1 describes a substrate that may be a piston ring, having an adhesive layer, an intermediate layer of tetrahedral carbon, and an outer layer of amorphous carbon.

DE 10 2005 063 123 B3 of applicant pertains to a sliding element, for example a piston ring, which comprises a wear layer and a run-in layer.

WO 2006/125683 A1 relates to a piston ring having a coating which comprises, from inside to outside, a first intermediate layer having at least one element of group IVB, VB or VIB, a second intermediate layer having a diamond-like, nanocomposite composition, and a diamond-like carbon layer.

SUMMARY OF THE INVENTION

An object underlying the invention is to provide a piston ring which can be manufactured with less effort than the piston rings known in the prior art and which at the same time meets the requirements regarding the friction values and/or service life.

Accordingly, the piston ring comprises, from inside to outside, an adhesive layer applied to a base material, a metal-containing amorphous carbon layer and a metal-free amorphous carbon layer. Due to this layer structure, the structure common in the prior art with a run-in layer and a separately formed wear protection layer can be dispensed with. The known wear protection layers are mostly formed as nitrided layers and require the use of steels having high contents of chromium, which are comparably expensive. Compared to this, high contents of chromium are not required according to the invention, and therefore the novel piston ring can be produced cost-effectively. Thus, a fundamental concept of the invention can also be seen in that the novel carbon coating on the substrate is only provided with a thin adhesive layer to promote adhesion between the substrate and the carbon layer, without interposition of a separate wear protection layer.

DETAILED DESCRIPTION

Tests have shown that the friction coefficients for the piston ring according to the invention are permanently low, as will be described in detail below. In this respect, the novel piston ring accordingly offers a long service life. The same is true for wear, for which it has been found that it is within limits that guarantee a long service life. The metal-containing amorphous carbon layer can be designated in accordance with the conventional designations (cf. VDI Guideline 2840) by the abbreviation a-C:H:Me. The corresponding designation for the metal-free amorphous carbon layer is a-C:H. The metal-free carbon layer can be applied, for example, as part of a separate process step within a PACVD (plasma-assisted chemical vapor deposition) method. Both amorphous carbon layers are DLC (diamond-like carbon) layers.

In the metal-containing carbon layer there are predominately $sp^2$ bonds. Due to this property, it could be found that the piston ring according to the invention has the properties desired for the piston ring. In particular, the proportions range from 20% to 70% of the total percentage of the carbon bonds.

With regard to the metal-free carbon layer, the $sp^3$ bond fraction is higher than the $sp^3$ bond fraction of the metal-containing carbon layer. A preferred bond fraction of $sp^3$ fractions is provided when an increased electrical resistance (Ohm) develops. While conventional DLC coatings have an electrical resistance in a range of less than 100 Ohm, the preferred increased electric resistance of the layer according to the invention is greater than 5000 Ohm, in particular greater than 5000 kOhm and preferably less than 10 kOhm.

Steel or cast iron has been found to be particularly favorable as the base material of the piston ring according to the invention.

The adhesive layer preferably contains chromium and can in particular consist predominantly of chromium. It has been found that such an adhesive layer comprises the desired properties promoting adhesion between the base material and the metal-containing amorphous carbon layer.

Based on test results, a maximum thickness of 2 μm, preferably approximately 0.5 μm, is currently favored for the adhesive layer.

As regards the metal contained in the metal-containing carbon layer, tungsten is currently favored. Particularly good properties were found for this in tests.

This similarly applies to that preferred embodiment in which the metal content within the metal-containing carbon layer decreases towards the outside.

With regard to the thickness, it is preferred for the metal-containing carbon layer to have a thickness of from approximately 1.5 to approximately 17 μm. In particular, good behavior was found with a layer thickness of approximately 1.5 μm.

Particularly good properties were moreover found for that embodiment in which the metal-containing carbon layer contains nanocrystalline carbide phases.

Furthermore, if the metal-free carbon layer has a thickness of from approximately 1 μm to approximately 15 μm, in particular approximately 1 μm, the piston ring provided therewith was found to have good properties.

The metal-containing and/or the metal-free carbon layer preferably also contains hydrogen. The available hydrogen has an influence on the degree of cross-linking of the carbon, thereby resulting in particularly hard layers.

Regarding the total thickness of the layers applied to the base material, this is currently preferred to be >approximately 2.9 μm and preferably <approximately 30 μm. This advantageously constitutes a difference over the previously known DLC layers, which are mostly thinner. Owing to the thicknesses that can be realized according to the invention, the advantage can be realized that this does not require a separate wear protection layer since the DLC layers act both as run-in and wear protection layers.

The surface hardness of the piston ring designed according to the invention is preferably from 1800 to 2800 HV, preferably up to 2400 HV 0.002. Measurement is carried out in this case using a nanoindenter with HV pl 0.002. The abbreviation pl stands for plastic, and the corresponding method is known to the persons skilled in the art. In particular applications, measurement using a nanoindenter with HV pl 0.02 is also possible.

It is currently preferred for the adhesive layer, which preferably consists of chromium, to be applied by means of metal vapor deposition.

It is currently preferred that the metal-containing and/or metal-free carbon layer is applied by means of a PACVD (plasma-assisted chemical vapor deposition) method.

Moreover, reference is made with regard to all of the features of the piston ring according to the invention, the coating provided thereon and the sliding partners preferably cooperating therewith to the aforementioned DE 10 2005 063 123 B3 or WO 2007/079834 A1, or US2009/001669 which is based thereon, the disclosure of which is made the subject matter of the present application with regard to the cited features.

EXAMPLES

A piston ring according to the invention having a coating with a total thickness of approximately 2.9 µm was produced, for which a hardness of 1935 HV 0.002 was determined. The piston ring was subjected to a wear test together with a piston ring having a nitrided layer as a wear protection layer and a mass-produced DLC-coated piston ring. This test was carried out at 190° C., a load of 50 N and using Castrol VP1 as oil. Silitec S260 was used for the bore. The corresponding product is known to the persons skilled in the art. After six hours, a wear of approximately 1.0 µm was determined for the piston ring according to the invention, and a wear of approximately 5.3 µm was determined for the mass-produced DLC-coated piston ring. The wear of the sliding partner usually increases in the case of a coating that is more resistant to wear. The coating according to the invention surprisingly does not show increased wear of the sliding partner such as the cylinder sleeve of the cylinder.

The wear of the cylinder sleeve was 2.7 µm for the piston ring according to the invention, and 2.8 µm for the mass-produced, DLC-coated piston ring. Moreover, the coefficient of friction was found to be significantly reduced for the piston ring according to the invention. Compared to a conventional DLC-coated piston ring, the coefficient of friction was found to be reduced by up to 30%.

Thus, it has been shown that advantageous properties are achieved for the piston ring according to the invention. As mentioned above, this applies in particular to the coefficient of friction, especially in the longer term, the run-in behavior and scuff resistance, which as a whole results in a durable piston ring.

The invention claimed is:

1. A piston ring having a DLC coating, wherein the piston ring comprises on a base material, of the piston ring from inside to outside, an adhesive layer, a metal-containing amorphous carbon layer and a metal-free amorphous carbon layer, $sp^2$ bonds predominating in the metal-containing carbon layer, and the metal-free carbon layer comprising $sp^2$ and $sp^3$ bonds, and the $sp^3$ bond fraction being higher than in the metal-containing carbon layer such that an electrical resistance of the DLC coating develops, which is greater than 5000 k Ohm;

wherein the base material is steel or cast iron;
wherein the adhesive layer contains chromium;
wherein the adhesive layer has a maximum thickness of approximately 2µm;
wherein the metal-containing carbon layer has a metal content that decreases towards the outside;
wherein the metal-containing carbon layer has a thickness of from about 1.5 to about 17 µm;
wherein the metal-containing carbon layer comprises nanocrystalline carbide phases;
wherein the metal-containing and/or the metal-free carbon layer contains hydrogen;
wherein the piston ring has a surface hardness of from 1800 to 2800 HV 0.002;
and wherein the piston ring lacks a run-in layer.

2. The piston ring according to claim 1, wherein the metal-containing carbon layer contains tungsten.

3. The piston ring according to claim 1, the metal-free carbon layer has a thickness of from about 1 to about 15 µm.

4. The piston ring according to claim 1, wherein the layers have a total thickness of from >about 2.9 µm, to about <30 µm.

5. The piston ring according to claim 1, wherein the adhesive layer is applied by means of metal vapor deposition.

6. The piston ring according to claim 1, wherein the metal-containing and/or the metal-free carbon layer is applied by means of a PACVD method.

* * * * *